United States Patent [19]
Fujio et al.

[11] Patent Number: 5,818,267
[45] Date of Patent: Oct. 6, 1998

[54] INPUT DETECTOR

[75] Inventors: Mitsuhiko Fujio, Iizuka; Masayuki Miyamoto, Nabari; Kunihiko Iizuka, Sakai; Hirofumi Matsui, Ikoma-gun, all of Japan

[73] Assignee: Sharp Kabushiki Kaisha, Osaka, Japan

[21] Appl. No.: 808,565

[22] Filed: Feb. 28, 1997

[30] Foreign Application Priority Data

Feb. 28, 1996 [JP] Japan ................................... 8-041789

[51] Int. Cl.⁶ ............................. G01R 19/00; H03L 5/00
[52] U.S. Cl. .............................................. 327/58; 327/307
[58] Field of Search ................................. 327/58–62, 70, 327/91, 94–96, 307, 337, 554

[56] References Cited

U.S. PATENT DOCUMENTS

| | | | |
|---|---|---|---|
| 5,281,860 | 1/1994 | Krenik et al. | 327/91 |
| 5,416,432 | 5/1995 | Lewis et al. | 327/60 |
| 5,703,503 | 12/1997 | Miyamoto et al. | 327/58 |
| 5,717,349 | 2/1998 | Bortot et al. | 327/62 |

FOREIGN PATENT DOCUMENTS

06053431 A  2/1994  Japan .............................. H01L 27/10

*Primary Examiner*—Toan Tran

[57] ABSTRACT

In respective comparators, a plurality of input voltages are compared with a comparison voltage that has been swept, and only the binary output of a D flipflop corresponding to the comparator that has exceeded the comparison voltage earliest is allowed to have "1", while the outputs corresponding to the rest of the comparators have "0". Therefore, it is possible to detect a maximum output by using the comparators of a normal CMOS construction and a binary-change detection means circuit constituted by logical circuits. Compared with the application of floating-gate MOS, this arrangement makes it possible to reduce costs, and also to easily carry out offset-voltage compensation for each comparator by using switched capacitors. As a result, in a maximum input detector which detects a maximum input from analog inputs through multiple channels by carrying out analog operations, it is possible to reduce costs, and also to improve detection precision.

12 Claims, 8 Drawing Sheets

INPUT DETECTOR

FIELD OF THE INVENTION

The present invention relates to an input detector for detecting a channel that corresponds to a maximum value or a minimum value, from inputs with multiple channels.

BACKGROUND OF THE INVENTION

Conventionally, the detection of a channel that corresponds to a maximum or minimum value of analog input signals through multiple channels has been carried out by converting the respective inputted analog signals into digital signals and subjecting the resulting digital data to operation processes. Therefore, as the number of input channels to be detected increases, the amount of operations increases to a great degree, thereby causing problems, such as the requirement for a high processing capability, a complex circuit construction and increased power consumption.

Figure 7:
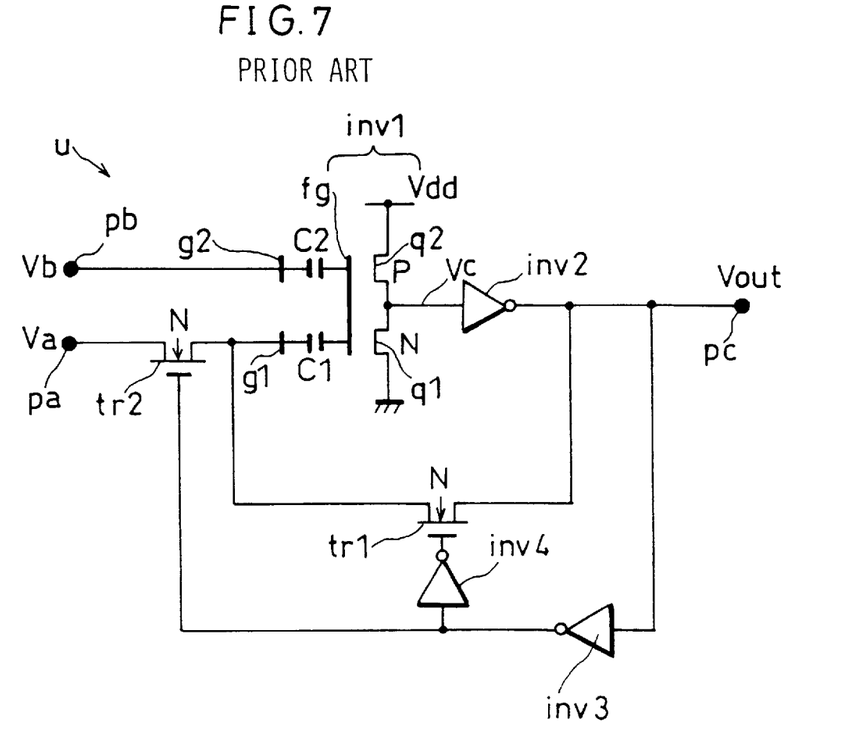
FIG. 7 is an electric circuit diagram of a unit circuit in a typical prior-art maximum input detector.
Figure 8:
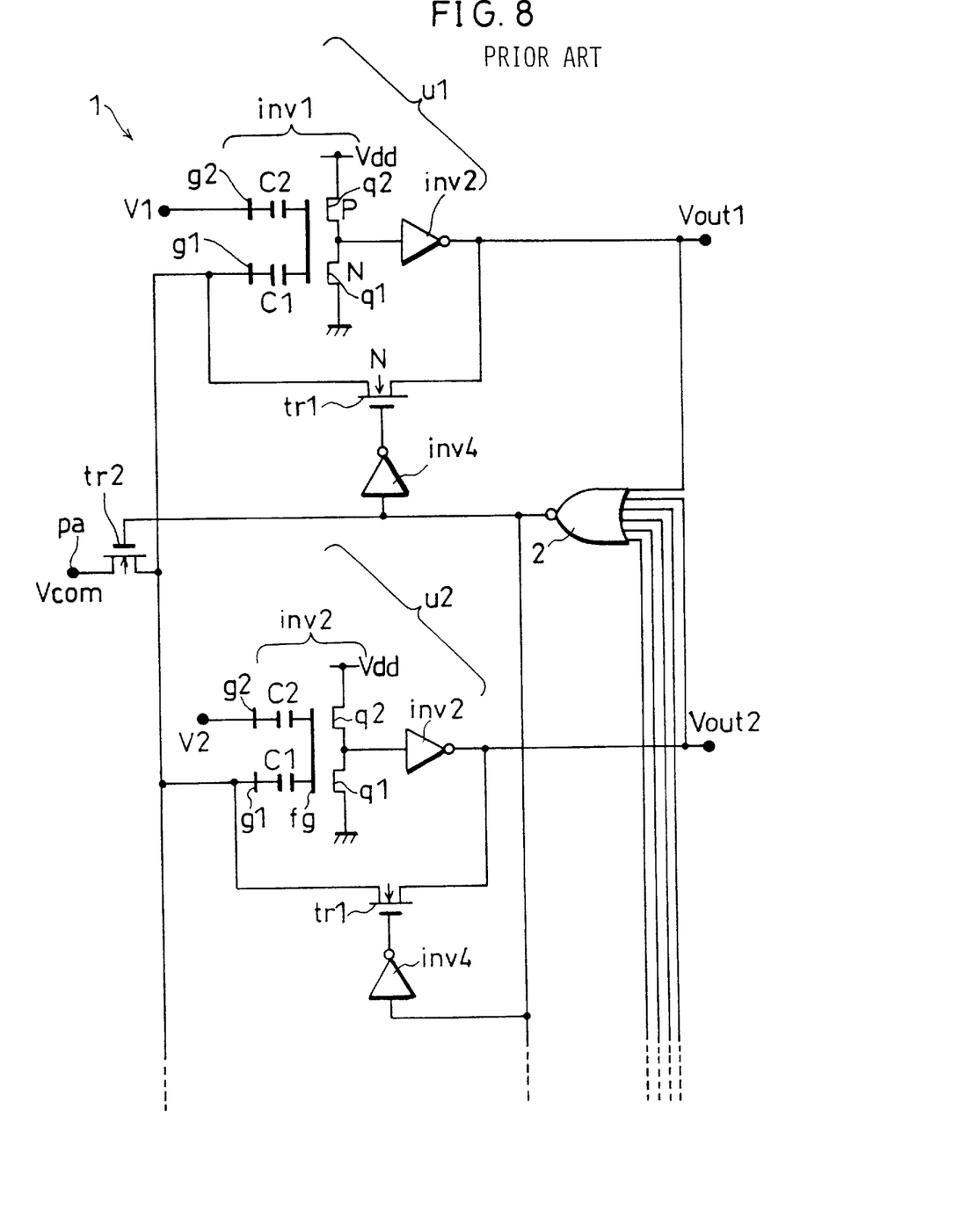
FIG. 8 is a circuit diagram showing the typical prior-art maximum input detector wherein the unit circuit shown in FIG. 7 is used.

In order to solve such problems, a circuit, which is referred to as a WTA circuit (Winner Take All Circuit) and which detects a maximum value or a minimum value on an analog basis with respect to analog input signals through multiple channels, has attracted attention. A typical prior art of such a WTA circuit has been disclosed in Japanese Laid-Open Patent Publication No. 53431/1994 (Tokukaihei 6-53431). FIGS. 7 and 8 show circuit diagrams for explaining the prior art, and a maximum input detector 1, shown in FIG. 8, is provided with the same number of unit circuits u shown in FIG. 7 as the number of input channels, as indicated by reference signs, u1, u2 . . . , etc.

Each unit circuit u is provided with inverters inv1, inv2, inv3 and inv4 and transistors tr1 and tr2. The inverters inv2 through inv4 are ordinary inverters, and the inverter inv1 is, in contrast, an inverter which has a CMOS (complementary metal-oxide semiconductor) construction with a floating gate fg, which is referred to as a neuron-MOS inverter.

The inverter inv1 is provided with a N-channel neuron-MOS transistor q1 and a P-channel neuron-MOS transistor q2. A high-level voltage Vdd is applied to the source of the transistor q2 and the source of the transistor q1 is connected to ground. The transistors q1 and q2 have the above-mentioned floating gates fg in the same manner, and an input voltage Vb is applied to the input gate g2 through the input terminal pb. Further, a comparison voltage Va, which is to be applied to the input terminal pa, is applied to the input gate g1 of the transistor q1 through the N-channel transistor tr2.

An output voltage Vc is drawn from the drains of the transistors q1 and q2, and the output voltage Vc appears at the output terminal pc as an output voltage Vout through the inverter inv2. In response to the output voltage Vout, the gate of the transistor tr2 is inverted by the inverter inv3. Moreover, the N-channel transistor tr1 is driven in response to the output voltage Vout through the inverters inv3 and inv4. Consequently, the output voltage Vout is fed back to the input gate g1.

The maximum input detector 1 is constituted by unit circuits u that are aligned in parallel with one other for a plurality of channels; however, in place of the above-mentioned inverter inv3, an NOR circuit 2 is adopted. Output voltages Vout 1, Vout 2, . . . , etc., released from the unit circuits u1, u2, . . . , etc., of the respective channels, are respectively inputted to the NOR circuit 2, and if at least one of the outputs of the channels goes high, the NOR circuit 2 outputs a low level to the respective unit circuits u. Moreover, the transistor tr2, which supplies the comparison voltage Vcom commonly to the input gates g1 of the unit circuits u, is controlled in response to the output of the NOR circuit 2.

In the above-mentioned unit circuits u, the fact that the input voltage Vb has become greater than the comparison voltage Va at the input terminal pa is detected as follows: At the time when a detection starts, the output voltage Vout is held low, that is, the transistor q1 is blocked while the transistor q2 is allowed to conduct, thereby maintaining the output voltage Vc of the inverter inv1 virtually at the above-mentioned voltage Vdd. In this case, the gate of the transistor tr2 goes high, thereby allowing the transistor tr2 to conduct, and the gate of the transistor tr1 goes low, thereby blocking the transistor tr1.

Supposing that C1 and C2 are capacitance-coupling constants between the input gates g1, g2 and the floating gate fg and that C0 is a capacitance-coupling constant between the floating gate fg and the substrate, the electric potential Vf of the floating gate fg is represented as follows with respect to the two input voltages Va and Vb:

$$Vf=(C1 \cdot Va+C2 \cdot Vb)/(C0+C1+C2) \qquad (1)$$

Here, it is supposed that the substrate is connected to ground.

In order for the output of the inverter inv1 to invert, it is necessary to make the voltage Vf greater than the inversion voltage Vth of the inverter inv1. Therefore, when the following inequality, based on the above-mentioned equation (1), is satisfied, the transistor q2 is blocked, the transistor q1 is allowed to conduct, and the output voltage Vc of the inverter inv1 becomes 0 V, which is the ground level, thereby allowing the output of the inverter inv1 to invert.

$$(C1 \cdot Va+C2 \cdot Vb)/(C0+C1+C2) \geq Vth \qquad (2)$$

Therefore, if the above-mentioned voltages Va and Vth are set so that upon receipt of Vb=0, the transistor q2 is allowed to conduct while the transistor q1 is blocked, that is, so that they satisfy the following inequality, $$C1 \cdot Va/(C0+C1+C2) < Vth \qquad (3);$$

then the transistor q2 is blocked and the transistor q1 is allowed to conduct so that the output voltage Vc starts to vary from the voltage Vdd to 0 V, when the input voltage Vb is varied from 0 V to Vdd until the following inequality has been satisfied:

$$Vb \geq \{(C0+C1+C2)Vth-C1 \cdot Va\}/C2 \qquad (4).$$

This voltage change is inverted and amplified by the inverter inv2 so that the output voltage Vout is allowed to rise abruptly from 0 V to the voltage Vdd. In this manner, it is possible to detect the fact that the input voltage Vb has become greater than the comparison voltage Va.

At this time, the gate of the transistor tr1 also reaches the voltage Vdd, thereby allowing the transistor tr1 to conduct as well as imposing the positive feedback of the output voltage Vout onto the input gate g1. Simultaneously, the gate of the transistor tr2 reaches 0 V, thereby blocking the transistor tr2 as well as allowing the output voltage Vout of the voltage Vdd to be stored in the input gate g1.

Taking the maximum input detector 1 of FIG. 8 into consideration based on the above-mentioned facts, the following inequality (5) needs to be satisfied in order to make the output voltage Vouti from the i-numbered unit circuit ui go high:

$$Vi \geq \{(C0+C1+C2)Vth-C1 \cdot Vcom\}/C2 \qquad (5).$$

Here, it is supposed that the input voltage of each of a plurality of channels is Vi (i=1, 2, . . . ) and that the comparison voltage is Vcom. Therefore, when the voltages Vth and Vcom are set so as to satisfy the following inequality (6) with respect of any number of i, the output voltages Vouti of all the channels become 0 V.

$$Vi < \{(C0+C1+C2)Vth - C1 \cdot Vcom\}/C2 \quad (6).$$

In this case, as the comparison voltage Vcom is swept from 0 V toward the voltage Vdd, the right side of the above-mentioned inequality (6) decreases monotonically with respect to the increase of the comparison voltage Vcom, and upon receipt of the highest input voltage Vj, the output voltage Voutj of the corresponding channel is first allowed to reach the voltage Vdd.

The output, inverted in this manner, allows the transistor tr1 of each unit circuit ui to conduct through the NOR circuit 2, and blocks the transistor tr2 so that the output voltage Vouti of the unit circuit ui is stored. Thus, only the output voltage Voutj of the channel with the maximum input voltage Vj is allowed to reach the voltage Vdd so that the output voltages Vouti of the rest of the channels with the input voltages Vi (i≠j) become 0 V, with the result that the channel with the maximum input is detected.

As described above, with respect to the analog input voltages Vi of a plurality of channels, the maximum input detector 1 makes it possible to detect the channel with the maximum input by using analog signals, as they are, without the need for complicated processes, such as analog-to-digital conversions and comparison processes of the results of conversions.

However, the above-mentioned prior-art maximum input detector 1, which is provided with the floating gate fg, requires a special manufacturing process that is different from the process for ordinary MOS-type semiconductors since the formation of the floating gate fg requires a high-precision control of the capacitance between the gate and the substrate, resulting in a problem of high costs.

Moreover, it is difficult to adjust the voltage Vf, which is generated by a charge, etc., accumulated in the floating gate fg, to a desired value with high precision, and variations tend to occur in the aforementioned capacitance-coupling coefficient C0 and other factors. Consequently, the offset voltages between the unit circuits ui of the channels differ from each other, thereby causing a reduced precision of the detection of the maximum value or the minimum value.

SUMMARY OF THE INVENTION

The objective of the present invention is to provide a low-cost input detector which can detect a maximum value or a minimum value with high precision.

In order to achieve the above-mentioned objective, the input detector of the present invention, which is an input detector for detecting which input voltage of a channel among input voltages of a plurality of channels has a maximum value or a minimum value, is provided with: a comparison-voltage generation circuit for sweeping voltages within a predetermined range so as to output the resulting voltage as a comparison voltage; comparison circuits each of which is independently installed in each channel and has input terminals one of which has the comparison voltage inputted thereto and the other of which has an input voltage from the corresponding channel inputted thereto; and a detection circuit which has outputs from the comparison circuits inputted thereto and which detects as the maximum value or the minimum value an input voltage of a channel corresponding to the comparison circuit whose output was inverted earliest among respective outputs.

With the above-mentioned arrangement, each comparison circuit compares the input voltage of the corresponding channel with the comparison voltage, and the detection circuit detects the channel the comparison results of which indicate the earliest inversion. The detection circuit detects the input of the comparison circuit whose output indicates the earliest inversion as the maximum value or the minimum value.

Therefore, the production of the comparison circuits and the detection circuit does not require a special manufacturing process such as required for manufacturing a floating-gate MOS, and they are produced by the same manufacturing process as the ordinary MOS-type semiconductor; therefore, it is possible to cut costs. Further, different from the floating-gate MOS, the comparison circuits do not have a construction which causes any difficulty in controlling the offset voltages, and are designed to easily adjust the offset voltages by using elements such as switched capacitors; thus, it becomes possible to improve detection precision of the maximum value or the minimum value.

Further, it is more preferable for the above-mentioned detection circuit to have a driving circuit which releases a trip output that becomes inoperative when upon receipt of outputs from the comparison circuits, all the output levels are mutually identical and that becomes operative when at least one of the output levels is different from the others, and also to have latch circuits each of which is individually installed in each channel, has an output from the corresponding comparison circuit inputted thereto, is reset at the start time of the sweeping operation of the comparison voltage, and holds the input at the time when the trip output becomes operative.

With this arrangement, when the driving circuit, which is constituted by circuits such as a NOR circuit having multiple channel inputs, generates the trip output upon detection of the fact that at least one of the binary outputs from the comparison circuits has changed, the latch circuits, which are constituted by elements such as D-flipflops, hold the binary outputs at the corresponding time from the comparison circuits respectively in response to the trip output from the driving circuit. Therefore, with respect to the outputs of the latch circuits corresponding to the respective channels, only the output of the latch circuit that corresponds to the channel whose input voltage has a maximum value or a minimum value is maintained at the inverted state. Thus, it becomes possible to achieve the detection circuit by using simple logical circuits.

In any of the above-mentioned arrangements, however, when the construction used for comparison is designed by an analog arithmetic circuit having the comparison circuit that is constituted by CMOS inverters and other elements, an input capacitor and a feedback capacitor, an offset voltage tends to occur by a charge accumulated in one of the input terminals of the comparison circuit that forms a floating gate.

For this reason, in order to compensate for the offset voltage, it is preferable for the input detector to have the following components in relation to the above-mentioned comparison circuits. That is, it is preferable to provide a first switch that is placed on the input side of the input capacitor, a second switch that is placed between the feedback capacitor and the output terminal, and a third switch that is placed between the input terminal and the output terminal, with respect to each of the comparison circuits. Further it is preferable for the input detector to have a control circuit which controls the switchover of the first through third switches and which applies a predetermined voltage to the input side of the input capacitor when the first switch is cut off, and also applies the voltage to the output side of the feedback capacitor when the second switch is cut off.

In the above-mentioned arrangement, the third switch is allowed to conduct in accordance with instructions of the control circuit so that a follower coupling is made across the input and output terminals of the comparison circuit so as to eliminate a charge accumulated in the node of the input terminal. Moreover, in accordance with instructions of the control circuit, the first and second switches cut off the input capacitor and feedback capacitor respectively from the input side or the output side, and the control circuit applies predetermined voltages, such as an operating-point voltage of the comparison circuit, to the respective capacitors. Therefore, a charge corresponding to the offset voltage is accumulated in the input capacitor and feed back capacitor. Thus, it becomes possible to compensate for the offset voltage and consequently to carry out the detection of the maximum value or the minimum value with high precision.

Furthermore, upon compensating for the offset voltage of each comparison circuit, the control circuit preferably controls the switchover of each of the first switches of the respective comparison circuits at the same time, controls the switchover of each of the second switches of the respective comparison circuits at the same time, and also controls the switchover of each of the third switches of the respective comparison circuits at the same time. In this arrangement, since the offset-voltage compensation is carried out on the respective comparison circuits at the same time by using a common voltage, it is possible to reduce time required for the compensation.

For a fuller understanding of the nature and advantages of the invention, reference should be made to the ensuing detailed description taken in conjunction with the accompanying drawings.

DESCRIPTION OF THE EMBODIMENT

[EMBODIMENT 1]

Figure 1:
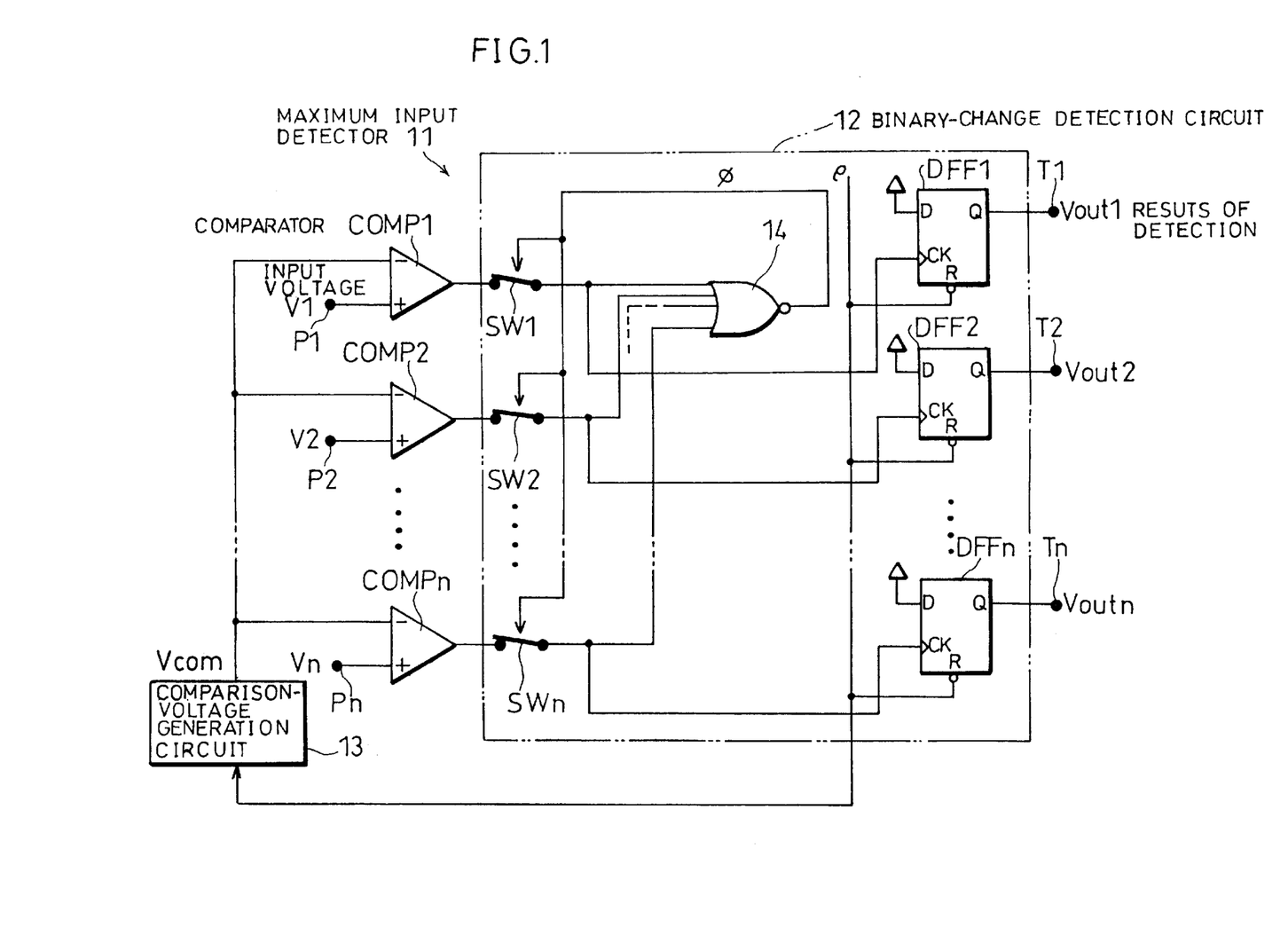
FIG. 1 is a block diagram showing an electrical construction of a maximum input detector of the first embodiment of the present invention.

Referring to FIG. 1, the following description will discuss one embodiment of the present invention.

FIG. 1 is a block diagram which shows an electrical construction of a maximum input detector 11 of the first embodiment of the present invention. The maximum input detector 11 is constituted by comparators COMP1, COMP2, ..., COMPn (hereinafter, indicated by reference symbol COMP when generally referred to) that are respectively installed for a plurality of input channels and that function as comparison means, a binary-change detection circuit 12 that functions as detection means, and a comparison-voltage generation circuit 13 that functions as a comparison-voltage generation means.

Each of the comparators COMP1 through COMPn is constructed by CMOS inverters and other elements, and a comparison voltage Vcom is commonly inputted to the inversion input terminals thereof from the comparison-voltage generation circuit 13, while analog input voltages V1, V2, ... Vn, which have been supplied to the input terminals P1, P2, ..., Pn, are respectively supplied to the non-inversion input terminals. Each comparator COMP releases a binary output which is set to "1" when the input voltage to the non-inversion input terminal is greater than the input voltage to the inversion input terminal and which is set to "0" when the input voltage to the non-inversion input terminal is not more than the input voltage to the inversion input terminal.

The binary-change detection circuit 12 is constituted by switches SW1, SW2, ..., SWn as well as D flipflops DFF1, DFF2, ..., DFFn that are individually installed in the channels, and a NOR circuit 14 that is commonly installed between the respective channels. Here, the NOR circuit 14 corresponds to a driving circuit disclosed in claims, and the D flipflops DFF1, DFF2, ..., DFFn (hereinafter, indicated by reference symbol DFF, when generally referred to) correspond to latch circuits. Further, the switches SW1, SW2, ..., SWn (hereinafter, indicated by reference symbol SW, when generally referred to) correspond to switching means that will be described later.

The binary outputs from the comparators COMP1 through COMPn are inputted to the clock input terminals CK of the corresponding D filpflops DFF1 through DFFn and also to the NOR circuit 14, through the switches SW1 through SWn. The NOR circuit 14 releases a trip output Φ which is set to "0" when at least either one of the inputs becomes "1" and which is also set to "1" only when all the inputs are "0". The respective switches SW are open and closed at the same time in association with each other by the trip output Φ; and in the case of "1" of the trip output Φ, they are conducted, and in the case of "0" thereof, they are cut off.

In the D flipflops DFF1 through DFFn, the binary outputs from the corresponding comparators COMP1 through COMPn are inputted to the clock terminals CK through the switches SW1 through SWn. Further, "1" is inputted to the data input terminals D, and a reset signal ρ is commonly inputted to the reset terminals R. The detection results Vout1 through Voutn of the binary output are outputted from the output terminals Q to the corresponding output terminals T1 through Tn. Therefore, since the D flipflops DFF, which have been all reset by the reset signal ρ, have "1" in their input terminals D, they release the output "1" from the output terminals Q when "1" is inputted to the clock input terminals CK, and the output state is maintained until the reset signal ρ has been again inputted.

The reset signal ρ is also inputted to the comparison-voltage generation circuit 13, and the comparison-voltage generation circuit 13 starts to sweep the comparison voltage Vcom from a sufficiently high voltage to a sufficiently low voltage in response to the reset signal ρ.

In the maximum input detector 11 having the above-mentioned construction, when the comparison-voltage generation circuit 13 starts to sweep the comparison voltage Vcom in response to the reset signal ρ, only the binary output of the comparator COMPj related to the channel j having the highest input voltage becomes "1", thereby allowing only the detection result Voutj of the D flipflop DFFj of the channel j to become "1". Further, in this case, the switches SW1 through SWn of all the channels are cut off by the trip output Φ from the NOR circuit 14, and the detection results Vouti from the rest of the D flipflops DFFi (i≠j) are all maintained at "0".

As described above, by using the comparator COMP of a normal CMOS construction and the binary-change detection circuit 12 consisting of logical circuits, it becomes possible to detect a maximum input, and also to achieve a maximum input detector at low costs by using a commonly-used manufacturing process.

Figure 2:
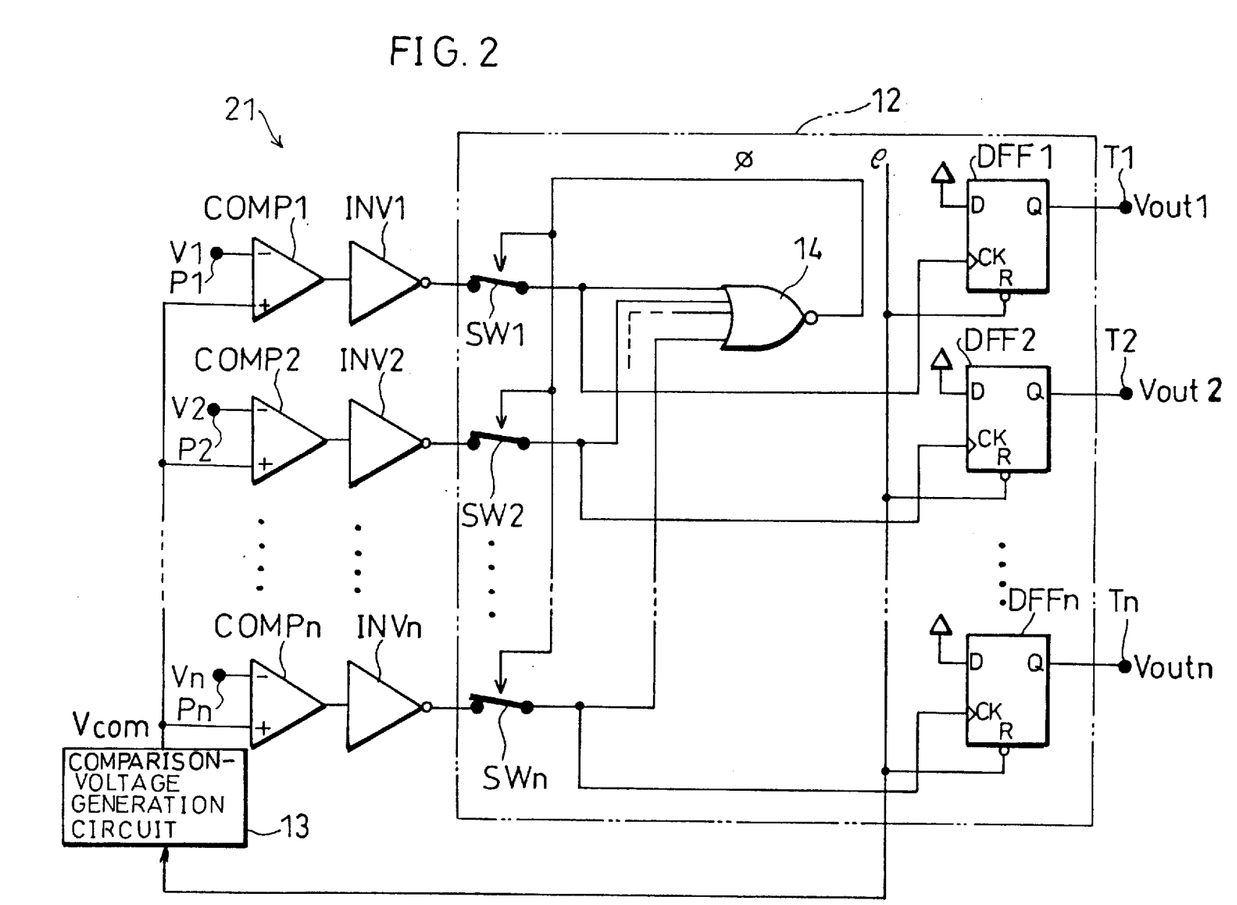
FIG. 2 is a block diagram showing an electrical construction of a maximum input detector of the second embodiment of the present invention.

Referring to FIG. 2, the following description will discuss the second embodiment of the present invention.

FIG. 2 is a block diagram which shows an electrical construction of a maximum input detector 21 of the second embodiment of the present invention. The maximum input detector 21 is similar to the aforementioned maximum input detector 11; therefore, the corresponding parts are indicated by the same reference numerals and the explanation thereof is omitted.

In this maximum input detector 21, the comparison voltage Vcom is inputted to the non-inversion input terminals of the respective comparators COMP1 through COMPn, and the input voltages V1 through Vn from the input terminals P1 through Pn are individually inputted to the inversion input terminals. For this reason, in order to invert the binary outputs from the respective comparators COMP1 through COMPn, inverters INV1 through INVn are respectively interpolated between the comparators COMP1 through COMPn and the switches SW1 through SWn.

As described above, by using the aforementioned maximum input detector 11 or the maximum input detector 21, it becomes possible to detect a maximum input irrespective of the input polarity of the comparators COMP.

Figure 3:
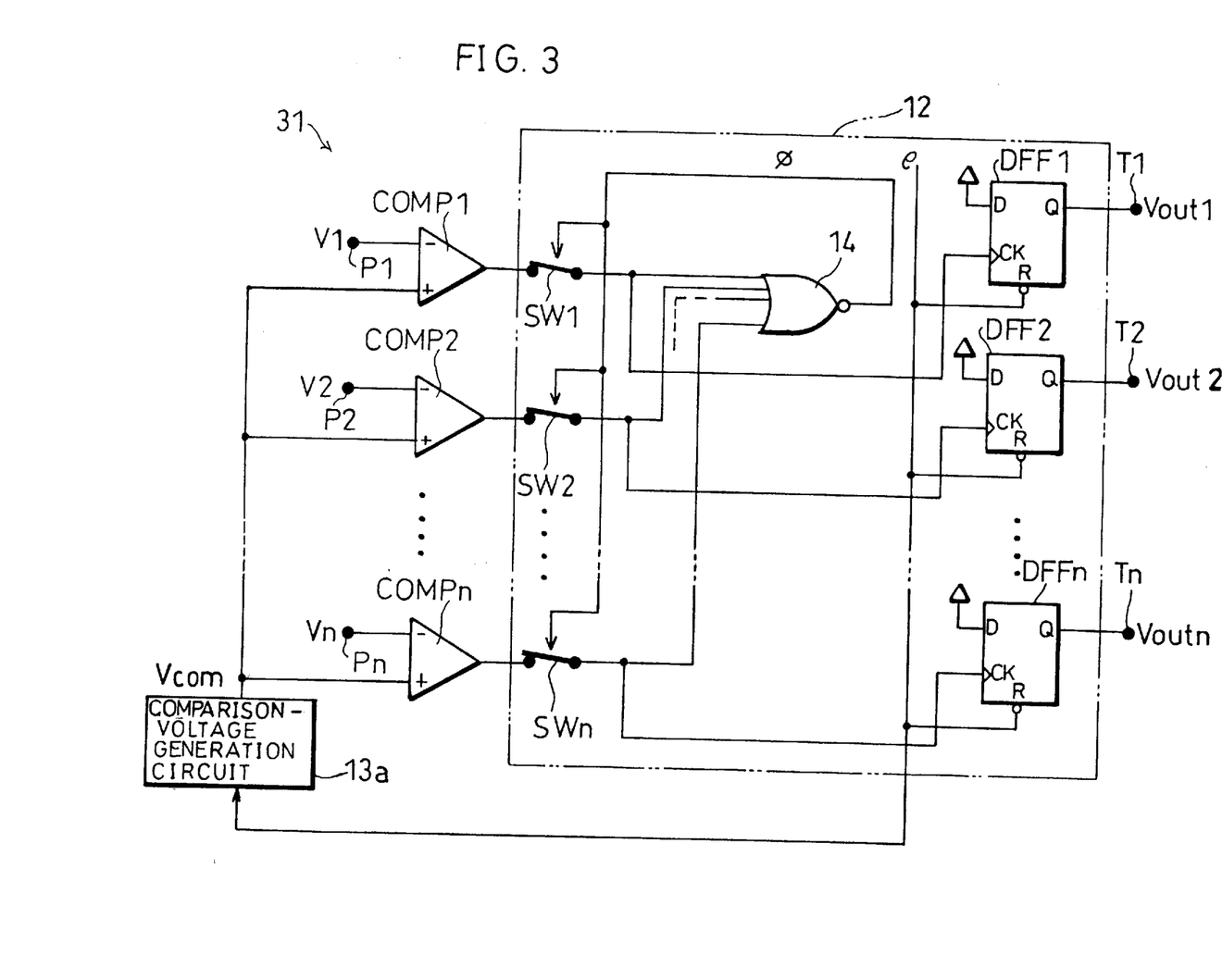
FIG. 3 is a block diagram showing an electrical construction of a minimum input detector of the third embodiment of the present invention.

Referring to FIG. 3, the following description will discuss the third embodiment of the present invention.

FIG. 3 is a block diagram which shows an electrical construction of a minimum input detector 31 of the third embodiment of the present invention. The minimum input detector 31 is similar to the aforementioned maximum input detector 11; therefore, the corresponding parts are indicated by the same reference numerals and the explanation thereof is omitted.

In this minimum input detector 31, it is required that among the outputs of the respective comparators COMP, only the binary output from the comparator COMPj related to the channel j having the smallest input voltage is set to "1" and that the binary outputs from the rest of the comparators COMPi (i≠j) are set to "0".

Therefore, the input voltages V1 through Vn, which are directed to the respective input terminals P1 through Pn, are respectively inputted to the inversion input terminals of the comparators COMP1 through COMPn, and the comparison voltage Vcom is commonly inputted to the non-inversion input terminals. Moreover, although a comparison-voltage generation circuit 13a has the same construction as the comparison-voltage generation circuit 13 shown in FIG. 1, it has a different sweeping direction of the comparison voltage Vcom. In other words, the comparison-voltage generation circuit 13a sweeps the comparison voltage Vcom from a sufficiently low voltage to a sufficiently high voltage in response to the reset signal ρ. Therefore, only the detection result Voutj related to the channel having the lowest input voltage becomes "1", and the detection results Vouti of the rest of the channels are all maintained at "0"; thus, it becomes possible to detect a minimum input.

Figure 4:
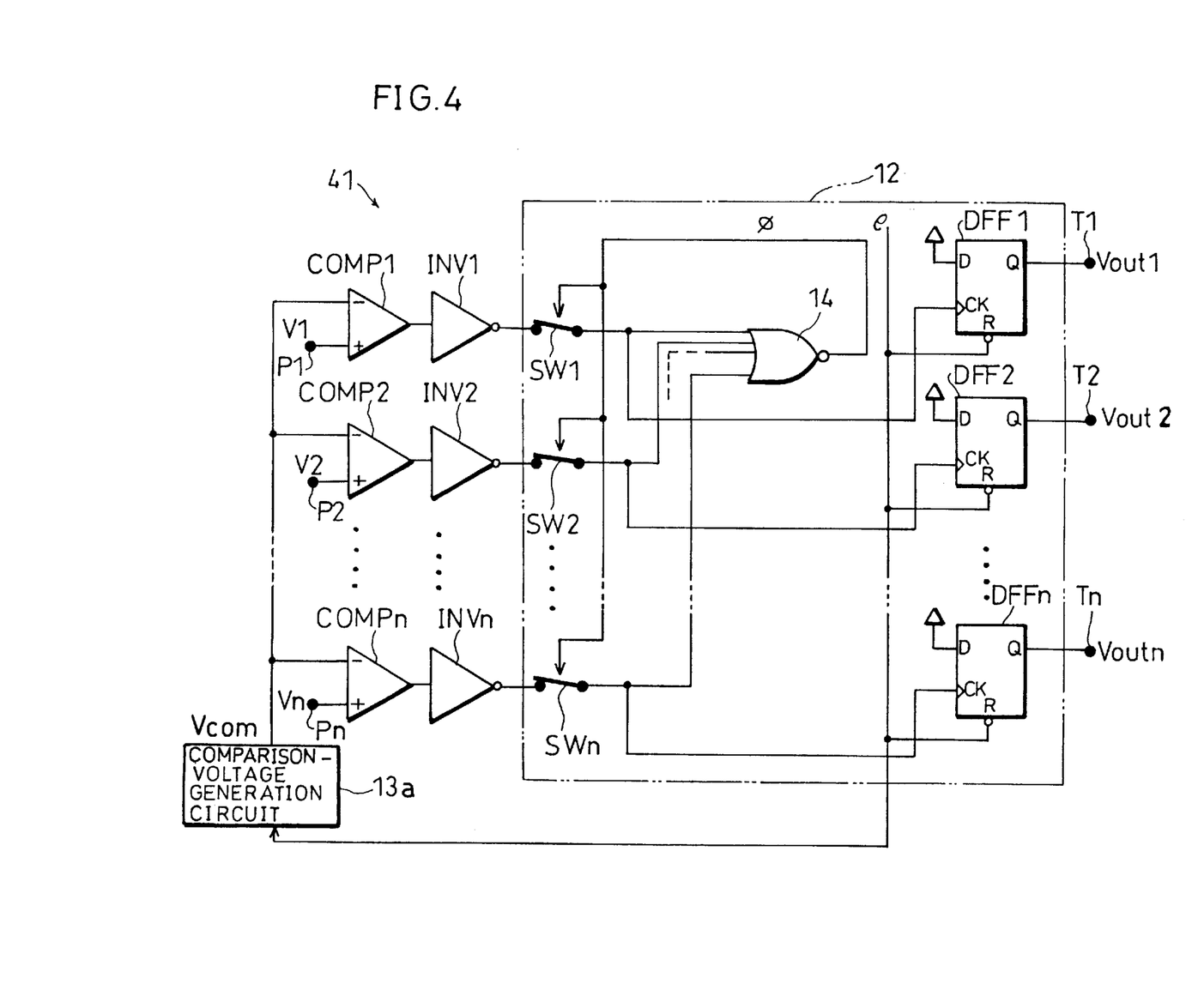
FIG. 4 is a block diagram showing an electrical construction of a minimum input detector of the fourth embodiment of the present invention.

Referring to FIG. 4, the following description will discuss the fourth embodiment of the present invention.

FIG. 4 is a block diagram which shows an electrical construction of a minimum input detector 41 of the fourth embodiment of the present invention. The minimum input detector 41 is similar to the aforementioned maximum input detector 21 and minimum input detector 31; therefore, the corresponding parts are indicated by the same reference numerals and the explanation thereof is omitted.

In this minimum input detector 41, the input voltages V1 through Vn are respectively inputted to the non-inversion input terminals of the respective comparators COMP1 through COMPn, and the comparison voltage Vcom, released from the comparison voltage generation circuit 13a, are commonly inputted to the inversion input terminals of the comparators COMP1 through COMPn. The binary outputs from the comparators COMP1 through COMPn are respectively inverted by the inverters INV1 through INVn, and then inputted to the switches SW1 through SWn.

As described above, by using the aforementioned minimum input detector 41 or the minimum input detector 31, it becomes possible to detect a minimum input irrespective of the input polarity of the comparators COMP.

Referring to FIGS. 5 and 6(a) through 6(c), the following description will discuss the fifth embodiment of the present invention.

Figure 5:
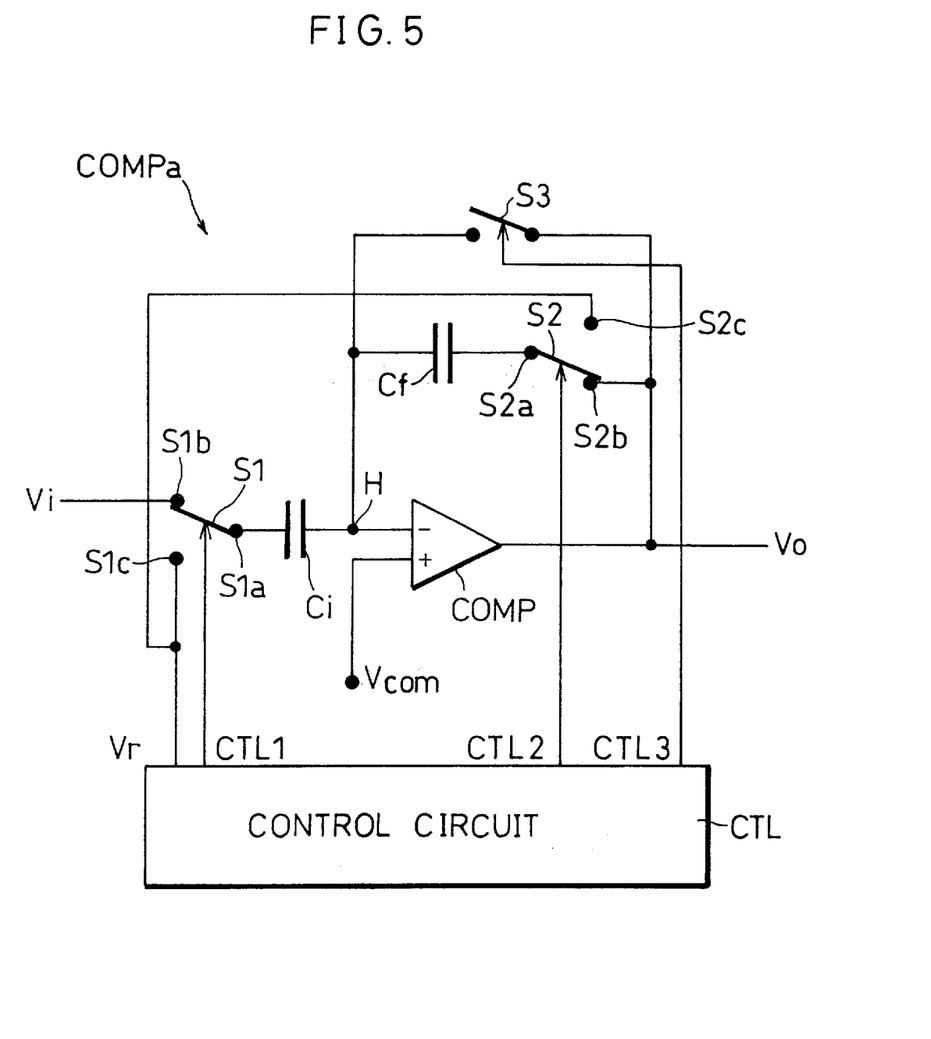
FIG. 5 is a block diagram showing an electrical construction of a comparator related to the fifth embodiment of the present invention.

FIG. 5 is an explanatory drawing that shows a construction of a comparator COMPa of the fifth embodiment of the present invention. In the comparator COMPa, an input capacitor Ci and a feedback capacitor Cf are installed in relation to the comparator COMP. Further, since this arrangement allows the node H on the inversion input terminal side of the comparator COMP to function as a floating gate, switches S1, S2 and S3 as well as a control circuit CTL are installed in order to compensate for an offset voltage resulted from a charge accumulated in the node H.

The switch S1, which is the first switch, is provided in relation to the input capacitor Ci, and constituted by a common contact S1a that is connected to the input terminal, one of the discrete contacts S1b to which the input voltage Vi is applied, and the other discrete contact S1c to which a reference voltage Vr used for compensating the offset voltage is applied upon compensation for the offset voltage. Further, the switch S2, which is the second switch, is provided in relation to the feedback capacitor Cf, and constituted by a common contact S2a that is connected to one of the input terminals of the feedback capacitor Cf, one of the discrete contacts S2b which is connected to the output terminal of the comparator COMP and to which the output voltage Vo is applied, and the other discrete contact S2c to which the reference voltage Vr is applied. Moreover, the switch S3, which is the third switch, is placed in parallel with the feedback capacitor Cf. The output terminal of the input capacitor Ci and the other input terminal of the feedback capacitor Cf are connected to the node H.

When a control signal CTL1 from the control circuit CTL goes low, the switch S1 conducts through the discrete contact S1b, and when the control signal CTL1 goes high, it conducts through the discrete contact S1c. Further, when a control signal CTL2 goes low, the switch S2 conducts through the discrete contact S2b, and when the control signal CTL2 goes high, it conducts through the discrete contact S2c. Moreover, when a control signal CTL3 goes low, the switch S3 is cut off, and when the control signal CTL3 goes high, it conducts.

Figure 6:
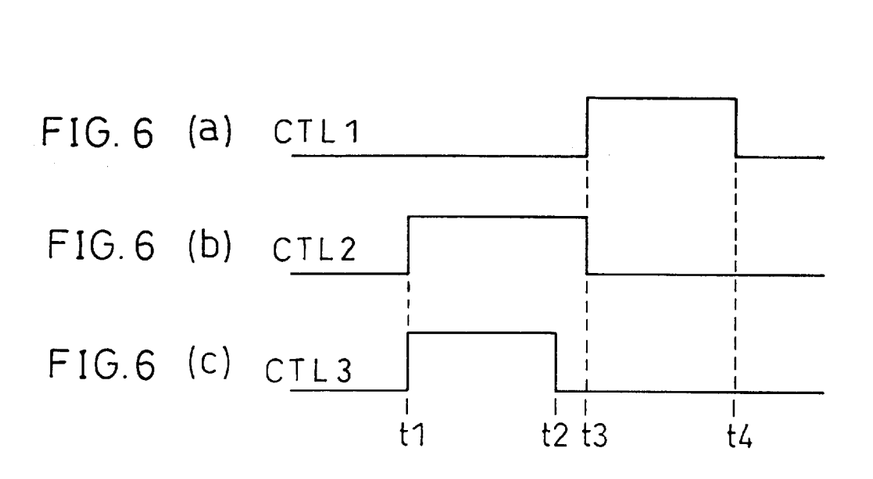
FIGS. 6(a) through 6(c) are timing charts that explain the operation of the comparator shown in FIG. 5.

FIGS. 6(a) through 6(c) are timing charts which explain operations of the respective switches S1 through S3. In the comparator COMPa having the above-mentioned arrangement, the control signals CTL1, CTL2 and CTL3 are all kept low as shown in FIGS. 6(a), 6(b) and 6(c) during a normal input-judging operation of the comparator COMP, and the input voltage Vi is applied to the inversion input terminal of the comparator COMP through the capacitor Ci, with the output voltage Vo being also applied thereto through the feedback capacitor Cf.

In contrast, during a voltage-compensating operation, the control signals CTL2 and CTL3 go high as shown by time t1. Therefore, the input voltage Vi is applied to the input terminal of the input capacitor Ci, and the output voltage Vo is applied to the node H which is the output terminal of the input capacitor Ci, and is also the other input terminal of the feedback capacitor Cf. Here, the reference voltage Vr is applied to the other input terminal of the feedback capacitor Cf. With respect to the magnitude of the reference voltage Vr, for example, the same value as an operating-point voltage of the comparator COMP of a CMOS construction is selected.

Therefore, in this state, the charge Q at the node H is represented as follows:

$$Q=Ci(Vo-Vi)+Cf(Vo-Vr) \qquad (9).$$

Here, supposing that the gain of the comparator COMP is A, and that the offset voltage at the operating point is Voff, the following equation holds:

$$Vo-Vr=A(Vr-Vo+Voff) \qquad (10).$$

When this equation (10) is solved with respect to Vo, the following equation is given:

$$Vo=Vr+\{A/(1+A)\}Voff \qquad (11).$$

Here, supposing that A is sufficiently great, the above-mentioned equation (11) is represented as follows:

$$Vo=Vr+Voff \qquad (12)$$

With the substitution of equation (12) in the aforementioned equation (9), the following equation is obtained:

$$Q=Ci(Vr+Voff-Vi)+Cf \cdot Voff \qquad (13)$$

Next, as indicated by time t2, the switch S3 is cut off by setting the control signal CTL3 low so that the node H is kept at a floating state. At this time, the charge Q is held.

Successively, as indicated by time t3, the control signal CTL2 is set low, and the control signal CTL1 is set high. Thus, the output voltage Vo is supplied to one of the input terminals of the feedback capacitor Cf, and the reference voltage Vr is supplied to the input terminal of the input capacitor Ci.

In this case, supposing that the charge of the node H is Qa and the electric potential thereof is Vh, the following equations (14) and (15) are obtained from the aforementioned equations (9) and (10):

$$Qa=Ci(Vh-Vr)+Cf(Vh-Vo) \qquad (14)$$

$$Vo-Vr=A(Vr-Vh+Voff) \qquad (15)$$

Here, solving the above-mentioned equation (15) with respect to Vh, and supposing that A is sufficiently great, the following equation is obtained:

$$Vh=Vr+Voff \qquad (16)$$

With the substitution of equation (16) in the above-mentioned equation (14), the following equation is obtained:

$$Qa=Ci \cdot Voff+Cf(Vr+Voff-Vo) \qquad (17)$$

Q=Qa holds based upon "law of conservation of electric charge"; thus, the following equation holds:

$$Ci(Vr+Voff-Vi)+Cf \cdot Voff=Ci \cdot Voff+Cf(Vr+Voff-Vo) \qquad (18)$$

Therefore, the input/output characteristic of the comparator COMPa is represented as follows:

$$Vo-Vr=(Ci/Cf)(Vi-Vr) \qquad (19)$$

Thus, it is possible to compensate for the offset voltage Voff.

The application of the comparator COMPa that can compensate for the offset voltage as described above to the aforementioned maximum input detection circuits 11 and 21, as well as to the minimum input detection circuits 31 and 41, makes it possible to detect a maximum input or a minimum input with high precision.

Further, since the same reference voltage Vr is commonly used for the offset-voltage compensation, the control circuit CTL is commonly used for a plurality of comparators COMPa so that the switches S1 through S3 are synchronously controlled; thus, the off-set voltage compensation is simultaneously carried out in the comparators COMPa for the respective channels.

As described in the above-mentioned first through fifth embodiments, the input detector, which is an input detector (21•31•41) for detecting which input voltage of a channel among input voltages of a plurality of channels has a maximum value or a minimum value, is provided with: a comparison-voltage generation circuit (13•13a) for sweeping voltages within a predetermined range so as to output the resulting voltage as a comparison voltage Vcom; comparison circuits (COMP; COMPa) each of which is individually installed in each input of the channels and has input terminals one of which has the comparison voltage Vcom inputted thereto and the other of which has the input voltage from the corresponding channel inputted thereto; and a detection circuit (binary-change detection circuit 12) which has outputs from the comparison circuits inputted thereto and which detects as the maximum value or the minimum value an input voltage of a channel corresponding to the comparison circuit whose output was inverted earliest among the respective outputs.

With the above-mentioned arrangement, each comparison circuit compares the input voltage of the corresponding channel with the comparison voltage Vcom, and the detection circuit detects the channel the comparison results of which indicate the earliest inversion. The detection circuit detects the input of the comparison circuit whose output indicates the earliest inversion as the maximum value or the minimum value.

Therefore, the production of the comparison circuits and the detection circuit does not require a special manufacturing process such as required for manufacturing a floating-gate MOS, and they are produced by the same manufacturing process as the ordinary MOS-type semiconductor;

therefore, it is possible to cut costs. Further, different from the floating-gate MOS, the comparison circuits do not have a construction which causes any difficulty in controlling the offset voltages, and are designed to easily adjust the offset voltages by using elements such as switched capacitors; thus, it becomes possible to improve detection precision of the maximum value or the minimum value.

Further, it is more preferable for the above-mentioned detection circuit to have: latch circuits (DFF) each of which is individually installed in each channel, has an output from the corresponding comparison circuit inputted thereto, and is reset at the start time of the sweeping operation of the comparison voltage; a driving circuit (NOR circuit 14) which has the outputs from the comparison circuits inputted thereto, and releases a trip output that becomes inoperative when all the output levels are mutually identical and that also becomes operative when at least one of the output levels is different from the others; and switching circuits which are placed between the comparison circuits and the latch circuits as well as the driving circuit, and are all cut off at the same time by the trip output.

With this arrangement, when the driving circuit, which is constituted by circuits such as a NOR circuit having multiple channel inputs, detects the fact that at least one of the binary outputs from the comparison circuits has changed, the switching circuits are cut off in response to the trip output from the driving circuit so that the comparison circuits and the latch circuits are disconnected; thus, the latch circuits, which are constituted by elements such as D-flipflops, are allowed to hold the binary outputs obtained from the respective comparison circuits at the corresponding time. Therefore, with respect to the binary outputs from the comparison circuits, it becomes possible to detect and hold the inversion of the outputs by using simple logical circuits.

In the above-mentioned arrangement, however, when the construction used for comparison is designed by an analog arithmetic circuit having the comparison circuit that is constituted by CMOS inverters and other elements, an input capacitor and a feedback capacitor, an offset voltage tends to occur by a charge accumulated in one of the input terminals of the comparison circuit that forms a floating gate.

For this reason, in order to compensate for the offset voltage, the input detector is preferably designed as described in the fifth embodiment so as to have the following components in relation to the above-mentioned comparison circuits. That is, in relation to the comparison circuits, it is preferable to provide an input capacitor that is interpolated on one side of the input terminals, a feedback capacitor that is connected across said input terminal and the output terminal of the corresponding comparison circuit, a first switching circuit that is capable of short-circuiting the terminals of the feedback capacitor, and a second switching circuit that cuts off the input capacitor and the feedback capacitor from the input and the output terminals respectively and that applies a predetermined voltage. Further, the input detector is also preferably provided with a control circuit (CTL) that controls the switchover of the first and second switching circuits.

In the above-mentioned arrangement, the first switching circuit short-circuits the terminals of the feedback capacitor in accordance with instructions of the control circuit so that a follower coupling is made between the input and output terminals of the comparison circuit so as to eliminate a charge accumulated in the node of the input terminal. Moreover, in accordance with instructions of the control circuit, the second switching circuit applies predetermined voltages, such as an operating-point voltage of the comparison circuit, to the respective input capacitor and feedback capacitor. Therefore, a charge corresponding to the offset voltage is accumulated in the input capacitor and feedback capacitor. Thus, it becomes possible to compensate for the offset voltage and consequently to carry out the detection of the maximum value or the minimum value with high precision.

Furthermore, it is preferable for the control circuit to compensate for the offset voltage of each comparison circuit by simultaneously controlling the switchover of each of the first switching circuits of the respective comparison circuits as well as simultaneously controlling the switchover of each of the second switching circuits of the respective comparison circuits. In this arrangement, since the compensation for the offset voltage is carried out at the same time by using a common voltage, it is possible to reduce time required for the compensation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An input detector, which detects which input voltage of a channel among input voltages of a plurality of channels has a maximum value or a minimum value, comprising:

a comparison-voltage generation means for sweeping voltages within a predetermined range so as to output the resulting voltage as a comparison voltage;

comparison means each of which is individually installed in each channel and has input terminals one of which has the comparison voltage inputted thereto and the other of which has an input voltage from the corresponding channel inputted thereto; and detection means which has outputs from the comparison means inputted thereto and which detects as the maximum value or the minimum value an input voltage of a channel corresponding to the comparison means whose output was inverted earliest among respective outputs.

2. The input detector as defined in claim 1, wherein the detection means comprises: a driving circuit which releases a trip output that becomes inoperative when upon receipt of outputs from the comparison means, all the output levels are mutually identical and that becomes operative when at least one of the output levels is different from the others, and latch circuits each of which is individually installed in each channel, has an output from the corresponding comparison means inputted thereto, is reset at the start time of the sweeping operation of the comparison voltage, and holds the input at the time when the trip output becomes operative.

3. The input detector as defined in claim 1, wherein: the comparison means includes a comparator which has a non-inversion input terminal having the input voltage applied thereto and an inversion input terminal having the comparison voltage applied thereto; the comparison-voltage generation means sweeps the predetermined range from the maximum voltage to the minimum voltage; and the detection means detects as the maximum value an input voltage of a channel corresponding to the comparison means whose output was inverted earliest.

4. The input detector as defined in claim 1, wherein: the comparison means includes a comparator which has a non-inversion input terminal having the comparison voltage applied thereto and an inversion input terminal having the input voltage applied thereto and an inverter which inverts an output of the corresponding comparator; the comparison-voltage generation means sweeps the predetermined range from the maximum voltage to the minimum voltage; and the detection means detects as the maximum value an input voltage of a channel corresponding to the comparison circuit whose output was inverted earliest.

5. The input detector as defined in claim 1, wherein: the comparison means includes a comparator which has a non-inversion input terminal having the comparison voltage applied thereto and an inversion input terminal having the input voltage applied thereto; the comparison-voltage generation means sweeps the predetermined range from the minimum voltage to the maximum voltage; and the detection means detects as the minimum value an input voltage of a channel corresponding to the comparison means whose output was inverted earliest.

6. The input detector as defined in claim 1, wherein: the comparison means includes a comparator which has a non-inversion input terminal having the input voltage applied thereto and an inversion input terminal having the comparison voltage applied thereto and an inverter which inverts an output of the corresponding comparator; the comparison-voltage generation means sweeps the predetermined range from the minimum voltage to the maximum voltage; and the detection means detects as the minimum value an input voltage of a channel corresponding to the comparison means whose output was inverted earliest.

7. The input detector as defined in claim 1, wherein: an input capacitor that is interpolated between one of the input terminals of each comparison means and the input voltage side of the corresponding channel, a feedback capacitor that is connected across the input terminal and the output terminal of the comparison means, a first switch that is placed on the input side of the input capacitor, a second switch that is placed across the feedback capacitor and the output terminal, and a third switch that is placed between the input terminal and the output terminal are installed in each comparison means; and the input detector further includes a control means which controls the switchover of the first through third switches and which applies a predetermined voltage to the input side of the input capacitor when the first switch is cut off, and also applies the voltage to the output side of the feedback capacitor when the second switch is cut off.

8. The input detector as defined in claim 7, wherein the control means controls the switchover of each of the first switches of the respective comparison circuits at the same time, controls the switchover of each of the second switches of the respective comparison circuits at the same time, and also controls the switchover of each of the third switches of the respective comparison circuits at the same time.

9. The input detector as defined in claim 7, wherein the predetermined voltage is set at an operating-point voltage of each comparison means.

10. An offset compensation method, which uses an input detector that comprises: a comparison-voltage generation means for sweeping voltages within a predetermined range so as to output the resulting voltage as a comparison voltage; comparison means each of which is individually installed in each channel and has input terminals one of which has the comparison voltage inputted thereto and the other of which has an input voltage from the corresponding channel inputted thereto; an input capacitor that is interpolated between one of the input terminals of each comparison means and the input side thereof and a feedback capacitor that is connected across the input terminal and the output terminal of the comparison means, the input capacitor and the feedback capacitor being provided with respect to each comparison means; and detection means which has outputs from the comparison means inputted thereto and which detects as the maximum value or the minimum value an input voltage of a channel corresponding to the comparison means whose output was inverted earliest among respective outputs, comprising:

a first step of short-circuiting the input terminal and the output terminal, as well as cutting off the end on the output terminal side of the feedback capacitor and the output terminal, in each comparison means so that the predetermined voltage is applied to the end; and a second step of cutting off the input terminal and the output terminal so that the predetermined voltage to the input terminal through the input capacitor, the second step being carried out after the first step.

11. The offset compensation method using the input detector as defied in claim 10, wherein: the first step is carried out in all the comparison means at the same time, and the second step is carried out in all the comparison means at the same time.

12. The offset compensation method using the input detector as defined in claim 10, wherein in the first and second steps, the predetermined voltage is set at an operating-point voltage of each comparison means.

* * * * *